United States Patent [19]

Jenq et al.

[11] Patent Number: 4,896,271
[45] Date of Patent: Jan. 23, 1990

[54] METHOD AND APPARATUS FOR MEASURING JITTER IN A PERIODIC SIGNAL

[75] Inventors: Yih-Chyun Jenq, Lake Oswego; Philip S. Crosby, Portland, both of Oreg.

[73] Assignee: Tektronix, Inc., Beaverton, Oreg.

[21] Appl. No.: 144,829

[22] Filed: Jan. 14, 1988

Related U.S. Application Data

[63] Continuation-in-part of Ser. No. 81,943, Aug. 5, 1987, Pat. No. 4,858,142.

[51] Int. Cl.$^4$ ............................................. G01R 29/02
[52] U.S. Cl. ..................................... 364/487; 364/486; 364/481; 324/83 D; 324/83 R; 375/118
[58] Field of Search ....................... 364/481, 486, 487; 324/832, 83 A, 83 D; 375/11, 8, 10

[56] References Cited

U.S. PATENT DOCUMENTS

| | | | |
|---|---|---|---|
| 4,158,857 | 6/1979 | Hiraguri | 324/121 R |
| 4,320,526 | 3/1982 | Gitlin | 375/118 |
| 4,327,258 | 4/1982 | Zumbahlen, Jr. et al. | 375/10 |
| 4,412,299 | 10/1983 | Huffman | 375/118 |
| 4,514,855 | 4/1985 | Lang et al. | 375/118 |
| 4,563,637 | 1/1986 | De Bortoli et al. | 375/118 |
| 4,654,861 | 3/1987 | Godard | 375/10 |
| 4,689,804 | 8/1987 | Srinivasagopalan et al. | 375/118 |
| 4,777,640 | 10/1988 | Turner et al. | 375/118 |

*Primary Examiner*—Parshotam S. Lall
*Assistant Examiner*—V. N. Trans
*Attorney, Agent, or Firm*—Daniel J. Bedell; Robert S. Hulse

[57] ABSTRACT

Jitter in a clock signal is measured by using the clock signal to clock a digitizer repetitively digitizing a highly stable sine wave signal so as to produce a first data sequence representing the magnitiude of the sine wave signal as a function of time. This first data sequence is normalized to produce a second data sequence having data elements that vary between maximum and minimun magnitudes of $+1$ and $-1$. The arcsine of each element of the second data sequence is then determined to provide a monotonically increasing third data sequence, wherein each element of the third data sequence indicates a phase angle associated with a corresponding element of the second data sequence. A fourth data sequence is then generated, each element of the fourth data sequence representing a difference between a phase angle represented by a corresponding element of the third data sequence and a phase angle that the corresponding element of the third data sequence would represent if the clock signal had a constant frequency. The fourth data sequence provides a measure of clock signal jitter as a function of time.

10 Claims, 6 Drawing Sheets

METHOD AND APPARATUS FOR MEASURING JITTER IN A PERIODIC SIGNAL

CROSS-REFERENCES TO RELATED APPLICATIONS

This is a continuation-in-part application of U.S. patent application entitled DIGITIZER EFFECTIVE RESOLUTION MEASUREMENT SYSTEM USING SINEWAVE PARAMETER ESTIMATION, Ser. No. 081,943, filed Aug. 5, 1987, U.S. Pat. No. 4,858,142.

BACKGROUND OF THE INVENTION

The present invention relates in general to systems for measuring signal parameters and in particular to a method and apparatus for measuring jitter in a periodic signal.

Periodic clocks are often used for timing purposes. For example a periodic clock signal may control a digitizer so that it periodically digitizes an input signal, thereby producing a data sequence representing the input signal as a function of time. In such an application the clock signal frequency should be substantially constant because frequency variation in the clock signal will cause the digitizer to digitize the input signal at unexpected times. In such case the data sequence provides a distorted representation of the input signal magnitude as a function of time. "Jitter" in a periodic signal is defined as a difference between a time at which an event in the signal (such as a zero crossing or a peak) actually occurs and an expected time of occurrence of the event if the frequency of the signal was perfectly stable. Thus the instantaneous jitter of a clock signal is a measure of its timing error at any given time. To evaluate the frequency stability of a clock signal source, it would be helpful to provide a quantitative measurement of its jitter as a function of time.

Jitter in a periodic signal can sometimes be detected by providing the signal as the vertical input to an oscilloscope having a horizontal sweep repetitively triggered by an event in the signal itself. Large amounts of jitter cause the resulting waveform display to be fuzzy. However, such a method of detecting jitter is usually not very effective when a periodic signal has only small amounts of jitter, and such method does not provide a quantitative measurement of jitter in a periodic signal as a function of time.

SUMMARY OF THE INVENTION

In accordance with one aspect of the invention, jitter in a clock signal is measured by using the clock signal to repetitively strobe a digitizer having a highly stable sine wave signal input. On each occurrence of a repetitive event in the clock signal (such as for example when the signal crosses a threshold level), the digitizer produces a data element that represents the instantaneous magnitude of the sine wave signal when the event occurred. Thus the digitizer produces a first sequence of data elements that vary in magnitude with the sine wave signal.

This first data sequence is applied as input to a first digital filter that "normalizes" the first data sequence to produce a second data sequence such that the second data sequence is a magnitude scaled version of the first data sequence having maximum and minimum peak amplitudes of +1 and −1. The second data sequence is applied as input to a second digital filter that generates as output a third data sequence, each element of the third data sequence indicating a phase angle that is a monotonically increasing arcsine function of a corresponding element of the second data sequence.

The third data sequence is applied as input to a third digital filter that generates a fourth data sequence. Each element of the fourth data sequence corresponds to an element of the third data sequence and represents a difference between a phase angle represented by the corresponding element of the third data sequence and a phase angle that the corresponding element of the third data sequence would represent if the clock signal had a constant frequency. The fourth data sequence is applied as input to a display system that displays a waveform in accordance with the fourth data sequence, the waveform providing a measure of jitter in the clock signal as a function of time.

It is accordingly an object of the invention to provide an improved method and apparatus for measuring jitter in a periodic signal.

The subject matter of the present invention is particularly pointed out and distinctly claimed in the concluding portion of this specification. However, both the organization and method of operation of the invention, together with further advantages and objects thereof, may best be understood by reference to the following description taken in connection with accompanying drawings wherein like reference characters refer to like elements.

DETAILED DESCRIPTION

Figure 1:
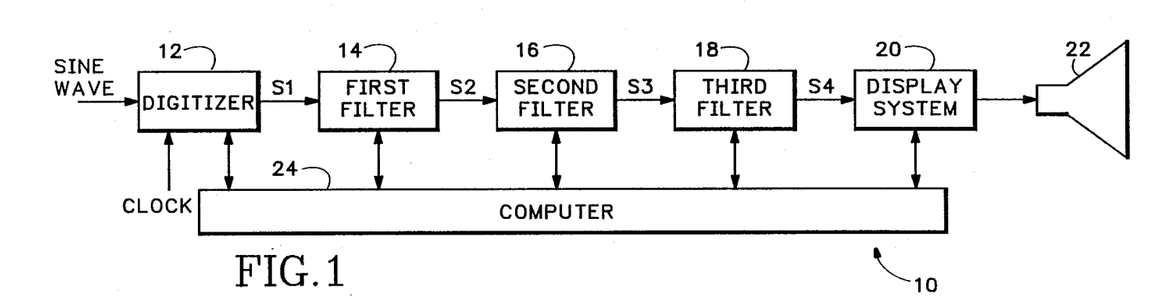
FIG. 1 is a block diagram of a jitter measuring apparatus in accordance with the present invention.

FIG. 1 shows in block diagram form a system 10 for measuring jitter in a clock signal. A highly stable reference sine wave signal is applied as input to a digitizer 12 that is clocked by the clock signal. The sine wave signal should have a frequency not more than half the frequency of the clock signal. On each of N consecutive occurrences of a repetitive event in the periodic clock signal (such as for example crossing of a threshold level), digitizer 12 produces a data element of an output first data sequence S1, each data element representing an instantaneous magnitude of the sine wave signal. Thus the first data sequence S1 comprises N data elements $s1_k$ (where k=0, 1, 2, . . . , N−1) that vary in magnitude with the sine wave signal.

The first data sequence S1 is applied as input to a first digital filter 14 that "normalizes" the first data sequence S1 to produce a second data sequence S2 wherein the $k^{th}$ element $s2_k$ of the second data sequence S1 corresponds to the $k^{th}$ element $s1_k$ of the first data sequence S2. To normalize the first data sequence, the first filter 14 analyzes the first data sequence to determine an offset parameter D characterizing the offset (if any) of the input sine wave signal, the "offset" being the magnitude of any DC component of the sine wave. The first filter 14 also analyzes the first data sequence to determine an amplitude parameter A characterizing the amplitude of the sinusoidal AC component of the input sine wave signal. The first filter then computes each element $s2_k$ of the second data sequence from a corresponding element $s1_k$ of the first data sequence in accordance with the expression:

$$s2_k = (s1_k - \widetilde{D})/\widetilde{A} \qquad [1]$$

were $\widetilde{D}$ is the estimate of D and $\widetilde{A}$ is the estimate of A. Suitable methods for estimating D and A are described in detail hereinbelow. Thus the second data sequence S2 is a sequence that would have been produced by digitizer 12 if its input sine wave signal had an amplitude A of 1 and an offset D of 0.

(It is noted that the first filter 14 could be eliminated by utilizing a sine wave input signal to digitizer 12 that has 0 offset and unity amplitude. In such case the digitizer 12 would produce the desired normalized second data sequence S2 directly. However, while it is not difficult in practice to produce a highly stable sine wave signal, it is possible but not easy to provide a sine wave signal that has amplitude and offset precisely adjusted to particular values.)

The second data sequence S2 is provided as input to a second digital filter 16 that generates as output a third data sequence S3. The $k^{th}$ element $s3_k$ of the third data sequence indicates a phase angle $\theta_k$ associated with the $k_{th}$ element $s2_k$ of the second data sequence S2. A method for computing the third data sequence S3 is described in detail hereinbelow.

The third data sequence is processed by a third digital filter 18 to provide a fourth data sequence S4. The $k^{th}$ element $s4_k$ of the fourth data sequence S4 corresponds to the $k^{th}$ element $s3_k$ of the third data sequence S3 and represents a phase difference between the phase angle $\theta_k$ actually represented by the corresponding element $s3_k$ of the third data sequence and a phase angle that the corresponding element of the third data sequence would represent if the clock signal had a constant frequency. The phase difference represented by each element of the fourth data sequence S4 is proportional to the timing error (jitter) of a corresponding pulse of the clock signal. Hence the fourth data sequence S4 represents jitter in the clock signal as a function of time. Operation of the third digital filter 18 is described in detail hereinbelow.

The fourth data sequence S4 provides input to a display system 20 that displays a waveform on a screen 22 in accordance with the fourth data sequence. Display system 20 is suitably a pixel-based display system wherein a waveform display is produced by selectively illuminating one pixel in each column of an array of rows and columns of pixels on screen 22. Each successive element of fourth data sequence S4 is associated with a successive column of the pixel array and its magnitude controls the vertical position on the associated column of the illuminated pixel. Since the fourth data sequence S4 represents jitter in the clock signal as a function of time, the waveform display also represents jitter in the clock signal as a function of time.

System 10 further includes a computer 24 for controlling operation of and data transfer between the digitizer 12, filters 14, 16, and 18 and display system 20. To initiate system operation, computer 24 transmits a start signal to digitizer 12 that causes the digitizer to begin digitizing the sine wave signal. When the digitizer 12 has produced and stored in an acquisition memory within digitizer 12 the first data sequence S1 of, for example 512 data elements, it transmits a "task complete" message to compute 24. Computer 24 then transmits sequences of address and control signals to digitizer 12 and to first filter 14 that cause the first data sequence S1 to be transferred from the acquisition memory in digitizer 12 to first filter 14.

Figure 2:
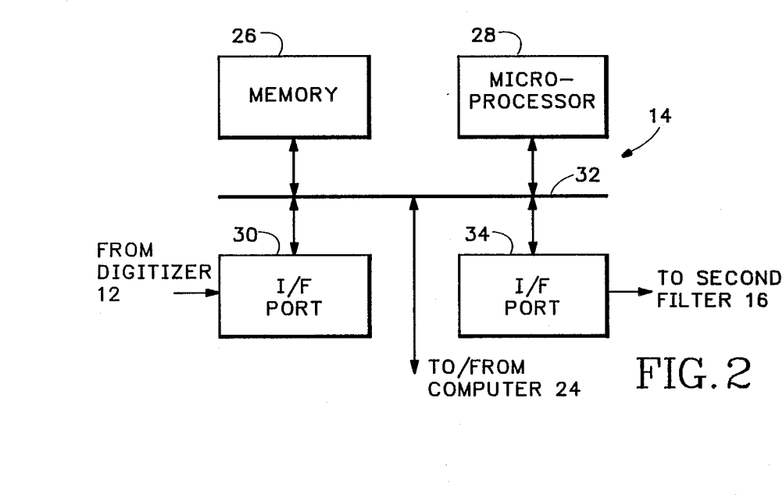
FIG. 2 is a block diagram of the first filter of FIG. 1.

With reference to FIG. 2, first filter 14 suitably comprises a random access memory 26 for receiving the input first data sequence S1 and a microprocessor 28 for generating the second data sequence S2 in accordance with program instructions also stored in memory 26. The input first data sequence S1 from digitizer 12 passes through a bus interface port 30 and onto a computer bus 32 to which memory 26 and microprocessor 28 are connected. Computer 24 of FIG. 1 accesses bus 32 and provides addressing control of memory 26 while the first data sequence S1 is written into memory 26. Thereafter, computer 24 transmits a message to microprocessor 28 via bus 32 telling the microprocessor to begin computing the second data sequence S2. Microprocessor 28 then computes the second data sequence S2, stores the result in memory 26, and thereafter transmits a message to computer 24 telling the computer that the microprocessor has completed its task. Computer 24 then transfers the second data sequence S2 out of memory 26 to second filter 16 of FIG. 1 via bus 32 and another bus interface port 34.

Second filter 16 and third filter 18 of FIG. 1 suitably have architecture similar to that of first filter 14 of FIG. 2 but are programmed to carry out different filter operations. Computer 24 causes second filter 16 to store incoming second sequence S2 in its internal memory, and to generate and store in its memory the third data sequence S3. Computer 24 thereafter transfers the third data sequence S3 to third filter 18. Similarly computer 24 causes third filter 18 to store its input third sequence S3 and to generate and store the fourth data sequence S4. Computer 24 subsequently transfers the fourth data sequence S4 to the display system 20. Computer 24 additionally provides suitable control signals to display system 20 that cause it to receive fourth data sequence S4 and to produce the waveform display in accordance therewith.

Figure 3:
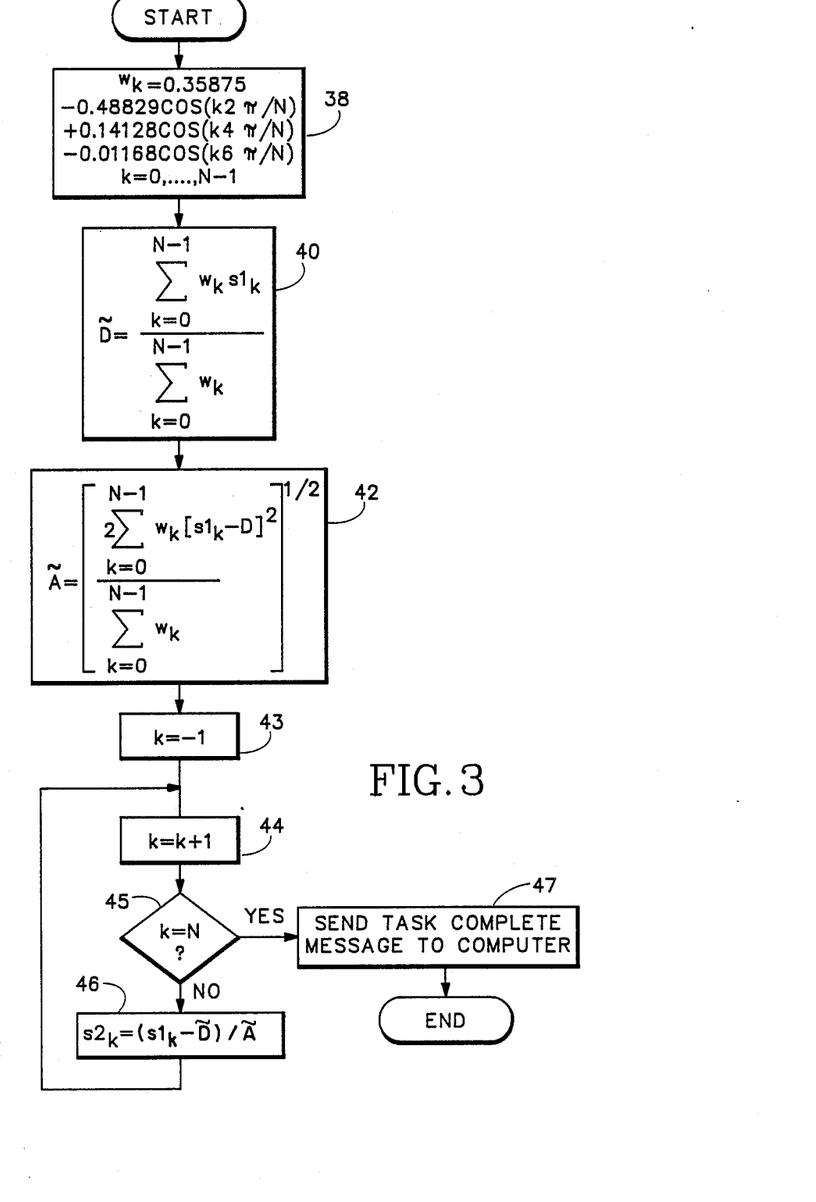
FIG. 3 shows a flow chart for programming the first filter of FIG. 1.

FIG. 3 is a flow chart for programming microprocessor 28 of FIG. 2 to produce the normalized second data sequence S2 in response to first data sequence S1. After the digitizer 12 has acquired an N element first data sequence $s1_k$ and after computer 24 has transferred the first data sequence into memory 26 of FIG. 2, microprocessor 28 calculates (step 38) a window sequence $W = \{w_k, k=0, 1, \ldots, N-1\}$ where $w_k$ is given by $$w_k = 0.35875 - 0.48829 \cos(k2\pi/N) + 0.14128 \cos(k4\pi/N) - 0.01168 \cos(k6\pi/N). \qquad [1.1]$$

This window sequence may be obtained by sampling the 4-term Blackman-Harris window described in the article "On the Use of Windows for Harmonic Analysis with the Discrete Fourier Transform", by F. J. Harris, Proceedings of the IEEE, Vol. 66, No. 1, Jan. 1978, pp. 51-83, which article is incorporated herein by reference.

The DC offset parameter D for the sine wave input signal is then estimated (step 40) in accordance with the following equation:

$$\bar{D} = \sum_{k=0}^{N-1} w_k s1_k \Big/ \sum_{k=0}^{N-1} w_k. \quad [2]$$

The "¯" symbol is used herein to identify a variable as an estimate of the actual value of the offset parameter D.

The amplitude parameter A for the sine wave input signal is estimated next (step 42) in accordance with the equation:

$$\bar{A} = \left[ 2 \sum_{k=0}^{N-1} w_k(s1_k - \bar{D})^2 \Big/ \sum_{k=0}^{N-1} w_k \right]^{\frac{1}{2}} \quad [3]$$

Each element $s2_k$ of the second data sequence is then computed from a corresponding element $s1_k$ of the first data sequence in accordance with the expression:

$$s2_k = (s1_k - \bar{D})/\bar{A}. \quad [4]$$

Starting in step 43, k is set to −1 and then (step 44) incremented by 1. If k is not equal to N (step 45) then the value of $s2_k$ is computed in accordance with equation [4] (step 46). The program then returns to step 44 where k is again incremented. The process continues to cycle through steps 44-46 until each element of the second data sequence S2 has been computed and stored in the filter's memory. When the value of k reaches N (step 45), then the filter sends a "task complete" message to computer 24 of FIG. 1 (step 47) and the program ends.

The principle from which equations [2] and [3] are derived is Poisson's summation formula. Letting $\phi(t)$ be an arbitrary function and letting $\phi(\omega)$ be its Fourier transform, Poisson's summation formula states:

$$\sum_{k=-\infty}^{+\infty} \phi(kT) = 1/T \sum_{k=-\infty}^{+\infty} \phi(k2\pi/T). \quad [5]$$

If the frequency $f_s = 1/T$ of the clock signal input to digitizer 12 is sufficiently large, such that $\phi(k2\pi f_s)$ is zero for non-zero k (i.e., no aliasing), then equation [5] becomes $$\sum_{k=-\infty}^{+\infty} \phi(k/f_s) = f_s\phi(0). \quad [6]$$

Let us consider the DC-offset estimator first. Let the input sine wave have magnitude $$s(t) = A\sin(\omega_0 t + \theta) + D \quad [6.1]$$

where $\omega_o = 2\pi f$. The sine wave $s(t)$ has a Fourier transform $$S(\omega) = j\pi A(\omega + \omega_o)e^{-j\theta} - j\pi A\delta(\omega - \omega_o)e^{j\theta} + 2\pi D\delta(\omega) \quad [6.2]$$

where $\delta(\ )$ is the delta function. Let $W(\omega)$ be the Fourier transform of the window function $w(t)$, where $w(t)$ is the 4-term Blackman-Harris window whose samples are given by equation [1.1], then the Fourier transform $G(\omega)$ of the product function $$g(t) = w(t)[A\cdot\sin(\omega t + \theta) + D] \quad [7]$$

is the frequency domain convolution of $S(\omega)$ and $W(\omega)$, i.e., $$G(\omega) = DW(\omega) + (jA/2)W(\omega + \omega_o)e^{-j\theta} - (jA/2)W(\omega - \omega_o)e^{j\theta}. \quad [8]$$

By substituting $\omega = 0$ into equation [7], we have $$G(0) = DW(0) + (jA/2)W(\omega_o)e^{-j\theta} - (jA/2)W(-\omega_o)e^{j\theta} \quad [9]$$

or $$G(0) = DW(0) + E_D(A,\theta,\omega_o) \quad [9.1]$$

where $E_D(\ )$ is an error term. Assuming no aliasing and applying Poisson's summation formula [5] to equation [9.1], we have $$D\sum_{k=0}^{N-1} w_k = \sum_{k=0}^{N-1} w_k s_k - f_s E_D(A,\theta,\omega_o). \quad [10]$$

The DC-offset estimator $\bar{D}$ of equation [2] is obtained by dropping the last term of equation [10]. Let us denote the difference between D and $\bar{D}$ by $\tilde{D}$, i.e., $\tilde{D} = D - \bar{D}$, the we have $$\Delta D = [A|W(\omega_o)|\sin(\theta + \omega_o N/2f_s)]/W(0) \quad [11]$$

If the data record S contains more than four cycles of the sine wave, then $|\Delta D| < |A|\cdot 10^{-9.2}$. In practice, if the additive noise (such as the quantization noise introduced by the waveform digitizer) is included, then an additional error term of approximately the size of $\sigma/(N)^{\frac{1}{2}}$ should be added, where $\sigma$ is the standard deviation of the additive noise.

We now turn our attention to the amplitude estimator $\bar{A}$. Let $h(t) = w(t)\cdot[s(t) - D]^2$, then the Fourier transform of $h(t)$ is $$H(\omega) = (A^2/2)W(\omega) - (A^2/4)[W(\omega + 2\omega_o)e^{-j2\theta} + W(\omega - 2\omega_o)e^{j2\theta}]. \quad [11.1]$$

By substituting $\omega = 0$ into the above equation, we have $$H(0) = (A^2/2)W(0) - (A^2/4)[W(2\omega_o)e^{-j2\theta} + W(-2\omega_o)e^{j2\theta}] \quad [12]$$

or $$H(0) = (A^2/2)W(0) - E_A(A,\theta,\omega_o) \quad [12.1]$$

where $E_A(\ )$ is an error term. Again by assuming no aliasing and by applying Poisson's summation formula, we have $$A^2 \sum_{k=0}^{N-1} w_k = 2\sum_{k=0}^{N-1} w_k(s_k - D)^2 + f_s 2E_A(A,\theta,\omega_o). \quad [13]$$

The amplitude estimator $\bar{A}$ of equation [3] is obtained from equation [13] by substituting $\bar{D}$ for D and dropping the last term in the above equation. Let $\Delta A^2$ be $A^2 - \bar{A}^2$, then from [12] and [13] we have $$\Delta A^2 = \{A^2|W(2\omega_o)|\cos[2\theta + (\omega_o N/f_s)]\}/W(0) \quad [14]$$

Under the condition that the data sequence S1 contain at least four cycles of the input sine wave signal, the normalized error $\Delta A/A$ is upper-bounded by $10^{-4.6}$.

Equations [11] and [14] give the closed form expressions for the errors encountered in the algorithm. It can be shown that 20log{W(f)/W(0)} is less than 92 dB for all $f_s$ with $N/f_s$ greater than 4. Hence, if the data record contains more than four cycles of sine wave, then the normalized errors $\Delta D/A$ and $\Delta A^2/A^2$ are less than $-92$ dB.

Figure 4A:
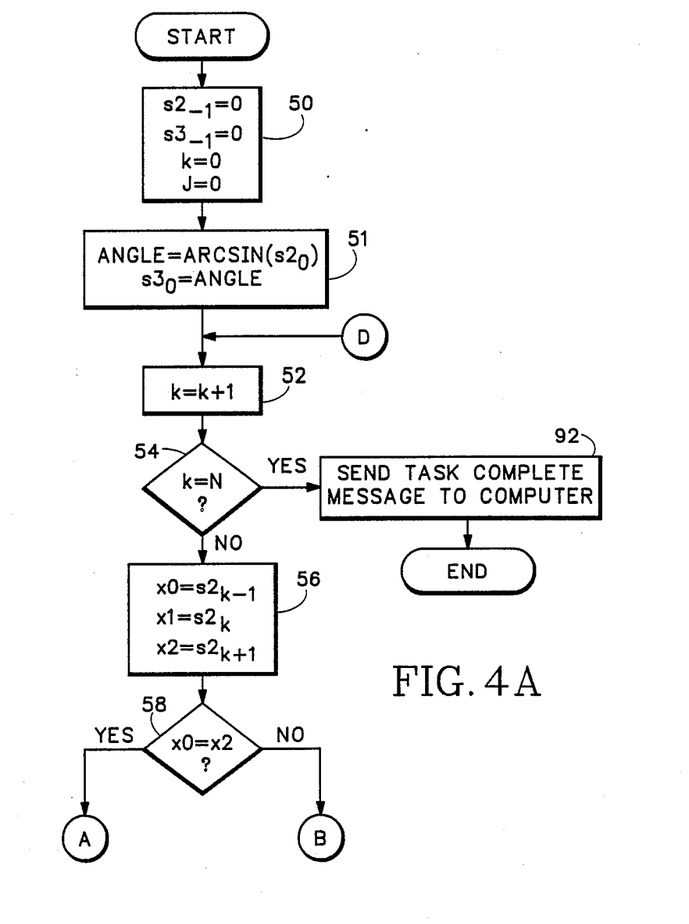
FIGS. 4A and 4B show a flow chart for programming the second filter of FIG. 1.
Figure 4B:
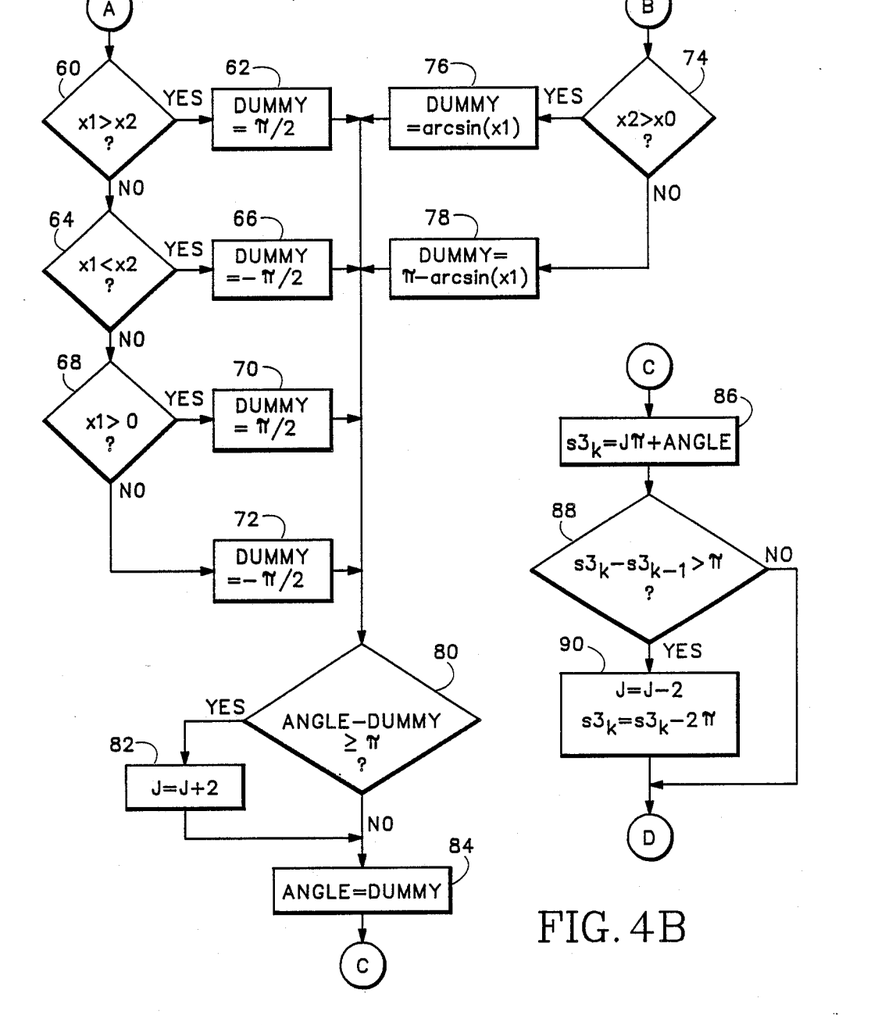

FIGS. 4A and 4B show a flow chart for programming a microprocessor within second filter 16 of FIG. 1 to produce the third data sequence S3 in response to second data sequence S2. As previously discussed, the $k^{th}$ element $s3_k$ of the third data sequence S3 indicates a phase angle $\theta_k$ associated with the corresponding $k^{th}$ element $s2_k$ of the second data sequence S2. The sequence of phase angles S3 is monotonically increasing, rather than cyclic.

After the first filter has generated an N element second data sequence S2 and the second data sequence has been transferred into the memory accessed by the microprocessor of the second filter, then starting in step 50, the second filter initializes a set of temporary variables $s2_{-1}$, $s3_{-1}$, k, and J to 0. A temporary variable ANGLE is set equal to the arcsine of the first element $s2_0$ of the second data sequence and the first element $s3_0$ of the third data sequence is set equal to ANGLE (step 51). The variable k is then incremented by 1 (step 52).

If k is not equal to N (step 54), then a variable x0 is set equal to $s2_{k-1}$, a variable x1 is set equal to $s2_k$, and a variable x2 is set equal to $s2_{k+1}$. Thus for a given value of k, variables x0, x1 and x2 equal the $(k-1)^{th}$, the $k^{th}$, and the $(k+1)^{th}$ elements of the second data sequence S2.

If x0 is equal to x2 (step 58) then $s2_k$ is either a positive or negative peak of the input second data sequence S2. If $s2_k$ is a positive peak, than a phase angle associated with $s2_k$ is an integer multiple of $\pi/2$ such that it is one of the set $\{\pi/2, 5\pi/2, 9\pi/2, \ldots\}$. On the other hand, if $s2_k$ is a negative peak, than the phase angle associated with $s2_k$ is an integer multiple of $\pi/2$ such that it is one of the set $\{3\pi/2, 7\pi/2, 11\pi/2, \ldots\}$. Accordingly, if x1 is greater than x2 (step 60), $s2_k$ is a positive peak and a temporary variable DUMMY is set equal to $\pi/2$ (step 62). Otherwise if x1 is less than x2 (step 64), $s2_k$ is a negative peak and DUMMY is set equal to $-\pi/2$ (step 66). If x1 is equal to x2, then $s2_k$ is a positive peak provided that x1 is positive (step 68). In such case DUMMY is set to $\pi/2$ (step 70). Otherwise, x2 is less than or equal to 0, indicating that $s2_k$ is a negative peak, and DUMMY is set to $-\pi/2$ (step 72).

Referring back to step 58, if x0 is not equal to X2, then $s2_k$ is not a peak of the second data sequence S2 and represents a magnitude during an increasing or decreasing portion of sequence S2. If $s2_k$ is part of an increasing portion of S2, then x2 is greater than x0 (step 74) and the value of DUMMY is set equal to arcsin (x1) (step 76). (Since sequence S2 is normalized, the arcsine of an element of S2 is a phase angle associated with the element). On the other hand, if $s2_k$ is part of a decreasing portion of S2, DUMMY is set equal to $\pi-$ arcsin(s1) (step 78).

Once the value of DUMMY has been set in one of steps 62, 66, 70, 72, 76 or 78 for a particular value of k, the value of DUMMY represents a phase angle associated with element $s2_k$. However, since DUMMY has a value between $+\pi$ and $-\pi$, we cannot set the value of the corresponding third data sequence element $s3_k$ to DUMMY because we want the third data sequence to be monotonically increasing rather than cyclic. Hence we add a multiple of $2\pi$ to DUMMY to obtain an appropriate value for $s3_k$. In step 80 the difference between ANGLE and DUMMY is compared to $\pi$. At this point ANGLE is the phase angle associated with element $s2_{k-1}$. If ANGLE-DUMMY is greater than or equal to $\pi$, then variable J is incremented by 2.

After step 82, or after step 80 if ANGLE-DUMMY is less than $\pi$, the value of ANGLE is set equal to DUMMY (step 84) and the value of element $s3_k$ of the third data sequence S3 is set equal to $J\pi+$ANGLE (step 86). If the difference between $s3_k$ and $s3_{k-1}$ is greater than $\pi$ (step 88), then J is decremented by 2 and $s3_k$ is decremented by $2\pi$ (step 90). The program then returns to step 52 where k is incremented by one. Thereafter, the value of the next element of third data sequence S3 is computed in the manner described. When the magnitude of k reaches N (step 54), all elements of the third data sequence S3 have been computed. In such case, the second filter transmits a "task complete" message to computer 24 of FIG. 1 (step 92) to tell the computer that sequence S3 is ready for transmission to the third filter 18 of FIG. 1. The program ends following step 92.

Figure 5:
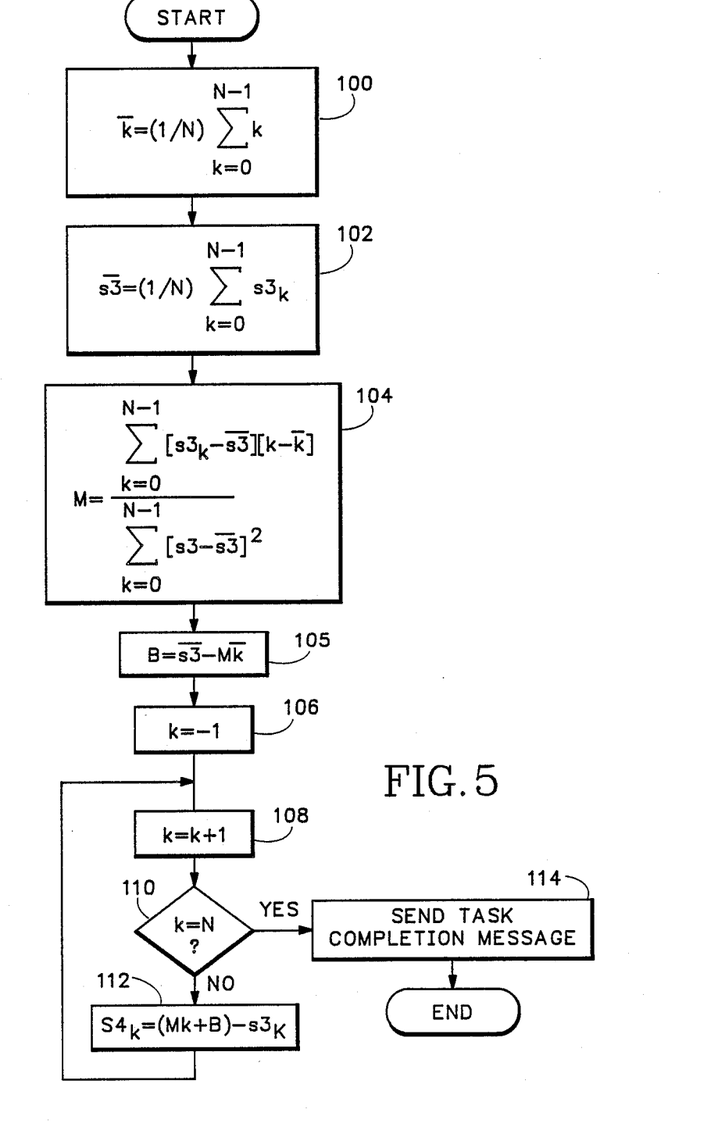
FIG. 5 shows a flow chart for programming the third filter of FIG. 1.
Figure 6:
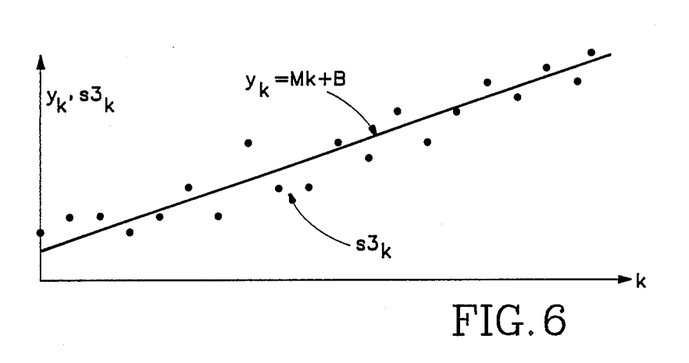
FIG. 6 is a plot of a data sequence output of the second filter of FIG. 1.
Figure 7:
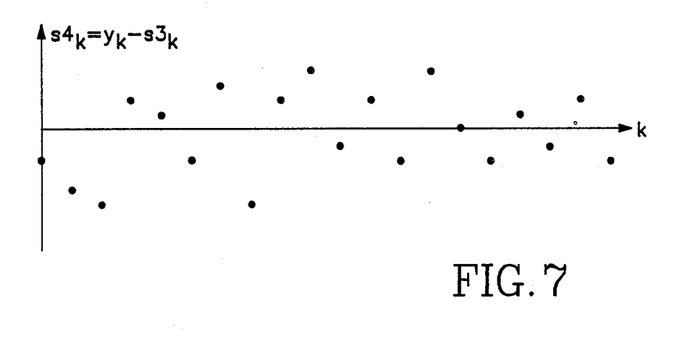
FIG. 7 is a plot of a data sequence output of the third filter of FIG. 1.

FIG. 5 shows a flow chart for programming the third filter 18 of FIG. 1 to produce the fourth data sequence S4 in response to the third data sequence S3. Third filter 18 suitably utilizes a linear regression technique to compute values of elements $s4_k$. FIG. 6 shows a histogram plot of magnitudes of elements of an example third data sequence $3_k$ as a function of k. Third filter 18 finds slope and intercept parameters M and B of a function $y_k=Mk+B$ that provides a least squares fit of the third data sequence to a straight line. The slope parameter M is a measure of the frequency of the sine wave signal input to digitizer 12 of FIG. 1 and the intercept parameter B is a measure of a phase angle of the input sine wave signal when digitization began. If the sine wave signal and clock signals are perfectly periodic, we would expect all values of $s3_k$ to lie along the line $y_k$. Thus assuming that the sine wave signal input is substantially jitter free, the difference $s4_k$ between the magnitude of each data sequence element $s3_k$ and the value of $y_k$ is a measure of the phase difference between the phase angle represented by the corresponding element $s3_k$ of third sequence, and the value of that element $s3_k$ would have if the clock signal input to digitizer 12 of FIG. 1 had a constant frequency. Thus the output data sequence S4 of third filter 18, plotted in FIG. 7, represents jitter in the clock signal as a function of time.

With reference to FIG. 5, a mean value k for k is computed by summing all values of k and dividing by N (step 100). A mean value s3 of S3 is then computed by summing all values of $s3_k$ and dividing by N (step 102). The value of M is next computed (step 104) in accordance with the expression:

$$M = \frac{\sum_{k=0}^{N-1} [s3_k - s3][k - k]}{\sum_{k=0}^{N-1} [s3_k - s3]^2}. \quad [15]$$

The value of B is computed (step 105) in accordance with the expression:

$$B = s3 - Mk. \quad [16]$$

The value of k is set to −1 in step 106 and then incremented by 1 in step 108. If k is not equal to N (step 110) then the value of $s4_k$ is computed in accordance with the expression $$s4_k = (Mk + B) - s3_k \quad [17]$$

and stored in memory. The program then returns to step 108 where k is again incremented. The value of each element $s4_k$ of the fourth data sequence is computed in a similar manner by iterating through steps 108, 110 and 112. When in step 110, the value of k reaches N, then in step 114 the filter sends a "task completed" to computer 24 of FIG. 1 to tell the computer that the fourth data sequence s4 has been computed and is available for transmission to the display system 20 of FIG. 1.

After display system 20 receives the data sequence s4, it produces a display similar to the plot shown in FIG. 7. For illustrative purposes, the number of data sequence elements plotted in FIGS. 6 and 7 is relatively small. When the data sequences S1–S4 include for example 512 elements, the display produced on screen 22 appears to be a substantially continuous waveform.

Thus a system for measuring jitter in a clock signal has been described. The display produced by display system 20 is actually a measure of relative jitter between the clock signal and the sine wave signal inputs to the digitizer. Hence, with reference to FIG. 1, to measure jitter in the clock signal input to digitizer 12, a highly stable sine wave signal is applied as input to the digitizer and the resulting display produced by display system 20 represents jitter in the clock signal as a function of time. However the system can also be used to measure jitter in a sine wave signal. To measure jitter in a relatively unstable sine wave signal, one applies a highly stable clock signal to the digitizer. The resulting display thus represents jitter in the sine wave signal.

It should be understood that while the preferred embodiment of the invention employs a sine wave signal as input to the digitizer, alternative embodiments of the invention may employ other continuously varying periodic signals as the input to the digitizer. In such case, it would be necessary to modify second filter 16 of FIG. 1. The function of the second filter 16 is to convert the normalized second data sequence S2 into a monotonically increasing data sequence S3 that represents a sequence of phase angles. Since in the preferred embodiment, the input signal to the digitizer is a sine wave, second filter 16 is designed to find the arcsine of the magnitude of each element of the normalized second data sequence, subject to monotonic conditions. If the input signal to digitizer 12 is a periodic signal other than a sine wave, then the relationship between the magnitude of a second data sequence S2 element and a phase angle is other than one of arcsine. Hence filter 16 must be altered so that it computes a phase angle in accordance with such relationship.

While in the preferred embodiment of the invention, filters 14, 16, and 18 are implemented by a filter pipeline wherein each filter is implemented by a separate microcomputer-based filter as illustrated in FIG. 2, it will be apparent to those skilled in the art that the functions of these filters may be implemented by a single filter such as that illustrated in FIG. 2 or by computer 24 itself. When computer 24 implements the functions of all filters 14, 16 and 18, computer 24 directly reads the first data sequence S1 out of digitizer 12, sequentially executes the operations of the three filters in the manner described by the flow charts of FIGS. 3–5 to produce data sequence S4, and then transmits sequence S4 to display system 20.

While preferred and alternative embodiments of the present invention have been described, it will be apparent to those skilled in the art that many changes and modifications may be made without departing from the invention in its broader aspects. The appended claims are therefore intended to cover all such changes and modifications as fall within the true spirit and scope of the invention.

We claim:

1. A method for measuring jitter in a clock signal comprising the steps of:
    digitizing a periodic signal on each of a plurality of occurrences of a repetitive event in the clock signal to produce a first data sequence of data elements, the first data sequence representing a magnitude of the periodic signal as a function of time;
    evaluating the first data sequence to provide a second data sequence of data elements representing phase angles associated with elements of the first data sequence;
    evaluating the second data sequence to determine expected phase angles that elements of the second data sequence would represent if the clock signal and the periodic signal had constant frequencies; and
    evaluating differences between phase angles represented by elements of the second data sequence and the expected phase angles.

2. The method in accordance with claim 1 further comprising the step of displaying a representation of said differences.

3. The method in accordance with claim 1 wherein said periodic signal is sinusoidal.

4. An apparatus for measuring jitter in a clock signal comprising:
    means for digitizing a periodic signal on each of a plurality of occurrences of a repetitive event in the clock signal to produce a first data sequence of data elements, the first data sequence representing a magnitude of the periodic signal as a function of time;
    means for evaluating the first data sequence to provide a second data sequence of data elements, each element of the second data sequence representing a phase angle associated with a corresponding element of the first data sequence; and
    means for evaluating the second data sequence to determine expected phase angles that the elements of the second data sequence would represent if the clock signal and the periodic signal had constant frequencies and for evaluating differences between phase angles represented by elements of the second data sequence and the expected phase angles.

5. The apparatus in accordance with claim 4 further comprising means for displaying a graphical representation of said differences.

6. The apparatus in accordance with claim 4 further comprising means for generating said periodic signal, said periodic signal being sinusoidal.

7. A method for measuring jitter in a clock signal comprising the steps of:
    digitizing a periodic signal on each of a plurality of occurrences of a repetitive event in the clock signal to produce a first data sequence of data elements representing a magnitude of the periodic signal as a function of time;

evaluating the first data sequence to provide a second data sequence of data elements representing phase angles associated with elements of the first data sequence wherein the step of evaluating the first data sequence to provide a second data sequence comprises the substeps of: normalizing the first data sequence to provide a normalized data sequence having N data elements $s2_k$ wherein $k=0, 1, 2, \ldots, N-1$, the normalized data sequence varying in magnitude between predetermined peak values; and evaluating the normalized data sequence to provide the second data sequence;

evaluating the second data sequence to determine phase angles that elements of the second data sequence would represent if the clock signal and the periodic signal had constant frequencies; and evaluating differences between phase angles represented by elements of the second data sequence and the expected phase angles.

8. The method in accordance with claim 7 wherein the step of evaluating the normalized data sequence to provide the second data sequence comprises the substep of:

generating a separate data element $s2_k$ of the second data sequence for each of successive values of $k>0$, each data element $s2_k$ representing a phase angle $\theta_k$ for each of successive values of $k>0$ such that if $s1_{k-1}$ is equal to $s1_{k+1}$, then $\theta_k$ is set equal to a selected integer multiple of $\pi/2$, otherwise $\theta_k$ is set equal to a sum of an arcsin function of $s1_k$ and a selected integer multiple of $\pi/2$, the integer multiple being selected for each $\theta_k$ such that $0 \leq \theta_k - \theta_{k-1} \leq \pi$ for all $k>1$.

9. An apparatus for measuring jitter in a clock signal comprising:

means for digitizing a periodic signal on each of a plurality of occurrences of a repetitive event in the clock signal to produce a first data sequence of data elements representing a magnitude of the periodic signal as a function of time;

means for evaluating the first data sequence to provide a second data sequence of data elements, each element of the second data sequence representing a phase angle associated with a corresponding element of the first data wherein said means for evaluating the first data sequence to provide a second data sequence comprises: means for normalizing the first data sequence to provide a normalized data sequence having N data elements $s2_k$ wherein $k=0, 1, 2, \ldots, N-1$, the normalized data sequence varying in magnitude between predetermined peak values; and means for evaluating the normalized data sequence to provide the second data sequence; and means for evaluating the second data sequence to determine expected phase angles that the elements of the second data sequence would represent if the clock signal and the periodic signal had a constant frequency, and for evaluating differences between phase angles represented by elements of the second data sequence and the expected phase angles.

10. The apparatus in accordance with claim 9 wherein said means for evaluating the normalized data sequence to provide the second data sequence comprises means for generating a separate data element $s2_k$ of the second data sequence for each of successive values of $k>0$, each data element $s2_k$ representing a phase angle $\theta_k$ such that if $s1_{k-1}$ is equal to $s1_{k-1}$, then $\theta_k$ is set equal to a selected integer multiple of $\pi/2$, otherwise $\theta_k$ is set equal to a sum of an arcsin function of $s1_k$ and a selected integer multiple of $\pi/2$, the integer multiple being selected for each $\theta_k$ such that $0 \leq \theta_k - \theta_{k-1} \leq \pi$ for all $k>1$.

* * * * *